(12) United States Patent
Halim et al.

(10) Patent No.: US 11,804,440 B2
(45) Date of Patent: Oct. 31, 2023

(54) CHIP MODULE WITH ROBUST IN-PACKAGE INTERCONNECTS

(71) Applicant: GLOBALFOUNDRIES U.S. Inc., Santa Clara, CA (US)

(72) Inventors: Saquib B. Halim, Bavaria (DE); Frank G. Kuechenmeister, Dresden (DE); Kashi V Machani, Dresden (DE); Christian Goetze, Dresden (DE)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 171 days.

(21) Appl. No.: 17/160,447

(22) Filed: Jan. 28, 2021

(65) Prior Publication Data
US 2022/0238448 A1 Jul. 28, 2022

(51) Int. Cl.
*H01L 23/538* (2006.01)
*H01L 23/00* (2006.01)

(52) U.S. Cl.
CPC ...... *H01L 23/5384* (2013.01); *H01L 23/5383* (2013.01); *H01L 23/5386* (2013.01); *H01L 24/14* (2013.01)

(58) Field of Classification Search
CPC .......... H01L 23/5384; H01L 23/5383; H01L 23/5386; H01L 24/14
See application file for complete search history.

(56) References Cited

U.S. PATENT DOCUMENTS

| | | | | |
|---|---|---|---|---|
| 5,378,927 | A * | 1/1995 | McAllister | .......... H01L 23/5384 |
| | | | | 257/776 |
| 6,879,506 | B2 * | 4/2005 | Lebourg | ................ H01L 27/101 |
| | | | | 257/E27.071 |
| 8,058,956 | B2 | 11/2011 | Jow et al. | |

(Continued)

FOREIGN PATENT DOCUMENTS

KR 100822542 B1 4/2008

OTHER PUBLICATIONS

Blackshear et al., "The Evolution of Build-Up Package Technology and its Design Challenges", IBM Journal of Research and Development, vol. 49, No. 4/5, 2005, pp. 641-661.

(Continued)

*Primary Examiner* — Trang Q Tran
(74) *Attorney, Agent, or Firm* — Anthony Canale; Hoffman Warnick LLC

(57) ABSTRACT

Disclosed are chip module structures, each having a robust in-package interconnect for reliable performance. Some of the chip module structures achieve interconnect robustness through the use of vias in a spiral step pattern within the interconnect itself. Some chip module structures achieve interconnect robustness through the use of an interconnect stabilizer (referred to herein as a stabilization structure, fence or cage)), which includes vias in a repeating step pattern encircling the in-package interconnect, which is electrically isolated from back side solder balls, front side collapse chip connections (referred to herein as C4 connections), and the interconnect itself, and which is optionally (Continued)

connected to ground. Some chip module structures achieve interconnect robustness through the use of a combination of both vias in a spiral step pattern within the interconnect itself and an interconnect stabilizer.

20 Claims, 5 Drawing Sheets

(56) References Cited

U.S. PATENT DOCUMENTS

| | | | |
|---|---|---|---|
| 8,085,112 | B2 | 12/2011 | Kushta et al. |
| 8,522,430 | B2 | 9/2013 | Kacker et al. |
| 10,170,385 | B2 | 1/2019 | Lin et al. |
| 2011/0284282 | A1* | 11/2011 | Ishida ............... H05K 1/0251 174/266 |
| 2016/0126171 | A1* | 5/2016 | Topacio ............ H01L 23/49894 257/738 |

OTHER PUBLICATIONS

Knadle, Kevin, "Reliability and Failure Mechanisms of Laminate Substrates in a Pb-free World", Endicott Technologies, Inc., IPC Apex Expo, 2009, pp. 1-13.

* cited by examiner

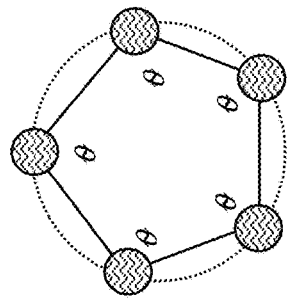
FIG. 4C
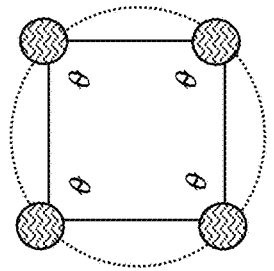
FIG. 4B
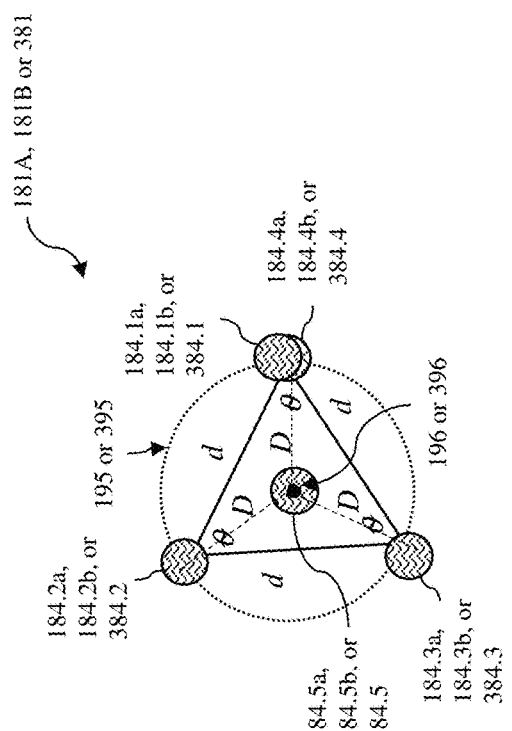
FIG. 4A
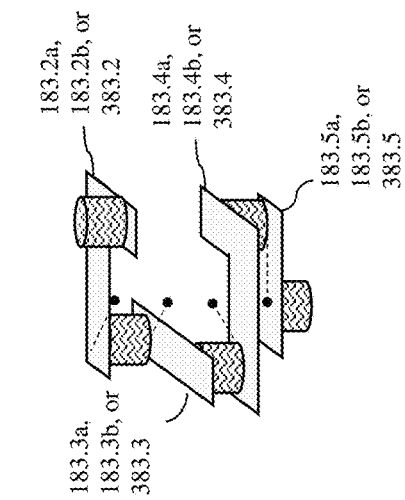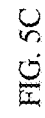
FIG. 5C
FIG. 5B
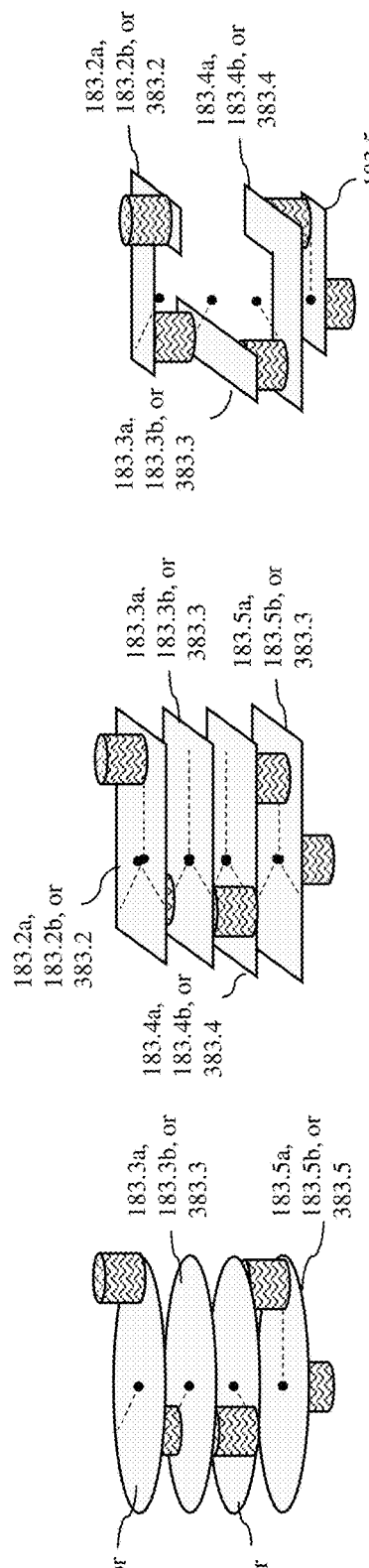
FIG. 5A

CHIP MODULE WITH ROBUST IN-PACKAGE INTERCONNECTS

BACKGROUND

Field of the Invention

The present invention relates to chip modules and, particularly, to embodiments of a chip module with robust in-package interconnect(s) for reliable performance.

Description of Related Art

A chip module includes a one or more chips and a package containing the chips. Specifically, a chip module can include a substrate (also referred to herein as a package substrate, laminate substrate or core) with front side and back side metal levels. Ball grid arrays (BGAs) (i.e., solder balls) are located on the outermost metal level of the back side metal levels to enable mounting of the chip module onto a printed circuit board (PCB) and to provide electrical connections between the chip module and the PCB (e.g., for power supply, signal transmission, etc.). Controlled collapse chip connections (C4 connections) are located on the outermost metal level of the front side metal levels to enable mounting of chip(s) onto the substrate (e.g., directly or indirectly by means of an interposer) and to provide electrical connections between the substrate and the chip(s). In-package C4-to-solder ball interconnects include a combination of stack vias, wires, etc. and facilitate chip to PCB communication. However, with advances in technology (e.g., with the development of 5th Generation (5G) wireless communication networks, state-of-the-art automotive vehicle applications, etc.) reliability risks (e.g., stress-induced fails) have been associated with in-package C4-to-solder ball interconnects and, particularly, the stacked vias therein. Thus, package manufacturers have increased the design rule restrictions associated with stacked vias. Unfortunately, the increase in design rule restrictions negatively impacts the performance potential of high operating frequency applications (e.g., in millimeter wave (mmWave) applications, terahertz (THz) applications, etc.), which are increasingly in demand by consumers.

SUMMARY

In view of the foregoing, disclosed herein are embodiments of a chip module with one or more robust in-package interconnect for reliable performance. In some embodiments, interconnect robustness is achieved through the use of vias in a spiral step pattern within the interconnect itself. In some embodiments, interconnect robustness is achieved through the use of an interconnect stabilizer (referred to herein as a stabilization structure, fence or cage), which includes vias in a repeating step pattern encircling the in-package interconnect, which is electrically isolated from back side solder balls, front side collapse chip connections (referred to herein as C4 connections), and the interconnect itself, and which is optionally connected to ground. In still other embodiments, interconnect robustness is achieved through the use of a combination of both vias in a spiral step pattern within the interconnect and an interconnect stabilizer with vias in a repeating step pattern encircling the interconnect. Such features provide both improved stress tolerance and controlled impedance transformation for mmWave applications.

More particularly, some embodiments of a chip module disclosed herein include a robust in-package interconnect where robustness is specifically achieved through the use of spiral step patterned vias within the interconnect itself. These embodiments can include a substrate (also referred to herein as a package substrate or laminate substrate). The substrate can have a front side and a back side opposite the front side. The chip module can further include front side metal levels on the front side of the substrate and back side metal levels on the back side of the substrate. Controlled collapse chip connections (referred to herein as C4 connections) can be on the front side metal levels and solder balls can be on the back side metal levels. An interconnect can electrically connect one of the C4 connections to one of the solder balls. This interconnect can include a stack of vias in the back side metal levels. These vias can be aligned with the solder ball. However, instead of the vias all being center aligned with the solder ball (i.e., one on top of the other over the center of the solder ball), within the stack, adjacent vias in different immediately adjacent metal levels can be offset in spiral step pattern. The interconnect can further include via connectors in the back side metal levels perpendicular to and between the vias within the stack such that the adjacent vias are electrically connected.

Other embodiments of a chip module disclosed herein include a robust in-package interconnect where robustness is achieved through the use of an interconnect stabilizer, which laterally surrounds the in-package interconnect, which is electrically isolated from back side solder balls, front side C4 connections, and the interconnect, and which includes vias in a repeating step pattern encircling the interconnect. More specifically, as with the previously described embodiments, these embodiments can include a substrate (also referred to herein as a package substrate or laminate substrate). The substrate can have a front side and a back side opposite the front side. The chip module can further include front side metal levels on the front side of the substrate and back side metal levels on the back side of the substrate. The chip module can further include C4 connections on the front side metal levels and solder balls on the back side metal levels. The chip module can further include TSVs, which extend vertically through the substrate from the front side to the back side. In these embodiments, the chip module can further include: an interconnect, which electrically connects one of the C4 connections to one of the solder balls, and an interconnect stabilizer (also referred to herein as an interconnect stabilization structure, fence or cage)), which laterally surrounds and provides mechanical stability (i.e., robustness) to the interconnect.

The interconnect stabilizer can include vias in the front side metal levels and in the back side metal levels encircling the interconnect. Within the front side metal levels and the back side metal levels, adjacent vias in different immediately adjacent metal levels can be offset in a repeating step pattern. The interconnect stabilizer can further include conductive plates in the front side metal levels and in the back side metal levels encircling the interconnect. Each of the above-mentioned vias can extend between and be in contact with adjacent conductive plates (i.e., immediately adjacent upper and lower plates). The interconnect stabilizer can further at least one of the TSVs extending between and in contact with proximal conductive plates such that the vias are all electrically connected. The interconnect stabilizer can also be electrically isolated from the interconnect, from the C4 connections (and, thereby from any chip mounted on the substrate by the C4 connections), and from the solder balls (and, thereby from any printed circuit board (PCB) onto which the chip module is mounted). Thus, it should be understood that the interconnect stabilizer will not be employed for signal routing. Optionally, however, the interconnect stabilizer can be electrically connected to ground.

In still other embodiments, the chip module can include a combination of the above-described features. That is, in still other embodiments the chip module can include an in-package interconnect with spiral step patterned vias as well as an interconnect stabilizer that laterally surrounds the interconnect.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 4A-4C are layout diagrams illustrating alternative equilateral shapes for the spiral step patterns of the vias within the in-package interconnects of FIG. 1;

FIGS. 5A-5C are three-dimensional diagrams illustrating alternative shapes for via connectors within the in-package interconnects of FIG. 1.

DETAILED DESCRIPTION

As mentioned above, a chip module includes a one or more chips and a package containing the chips. Specifically, a chip module can include a substrate (also referred to herein as a package substrate, laminate substrate or core) with front side and back side metal levels. Ball grid arrays (BGAs) (i.e., solder balls) are located on the outermost metal level of the back side metal levels to enable mounting of the chip module onto a printed circuit board (PCB) and to provide electrical connections between the chip module and the PCB (e.g., for power supply, signal transmission, etc.). Controlled collapse chip connections (C4 connections) are located on the outermost metal level of the front side metal levels to enable mounting of chip(s) onto the substrate (e.g., directly or indirectly by means of an interposer) and to provide electrical connections between the substrate and the chip(s). In-package C4-to-solder ball interconnects include a combination of stack vias, wires, etc. and facilitate chip to PCB communication. However, with advances in technology (e.g., with the development of 5th Generation (5G) wireless communication networks, state-of-the-art automotive vehicle applications, etc.) reliability risks (e.g., stress-induced fails) have been associated with in-package C4-to-solder ball interconnects and, particularly, the stacked vias therein. Thus, package manufacturers have increased the design rule restrictions associated with stacked vias. Unfortunately, the increase in design rule restrictions negatively impacts the performance potential of high operating frequency applications (e.g., in millimeter wave (mmWave) applications, terahertz (THz) applications, etc.), which are increasingly in demand by consumers.

In view of the foregoing, disclosed herein are embodiments of a chip module with one or more robust in-package C4-to-solder ball interconnects for reliable performance. In some embodiments, interconnect robustness is achieved through the use of vias in a spiral step pattern within the interconnect itself. In some embodiments, interconnect robustness is achieved through the use of an interconnect stabilizer (referred to herein as a stabilization structure, fence or cage), which includes vias in a repeating step pattern encircling the in-package interconnect, which is electrically isolated from back side solder balls, front side C4 connections, and the interconnect itself, and which is optionally connected to ground. In still other embodiments, interconnect robustness is achieved through the use of a combination of both vias in a spiral step pattern within the interconnect and an interconnect stabilizer with vias in a repeating step pattern encircling the interconnect. Such features provide both improved stress tolerance and controlled impedance transformation for mmWave applications.

Figure 1:
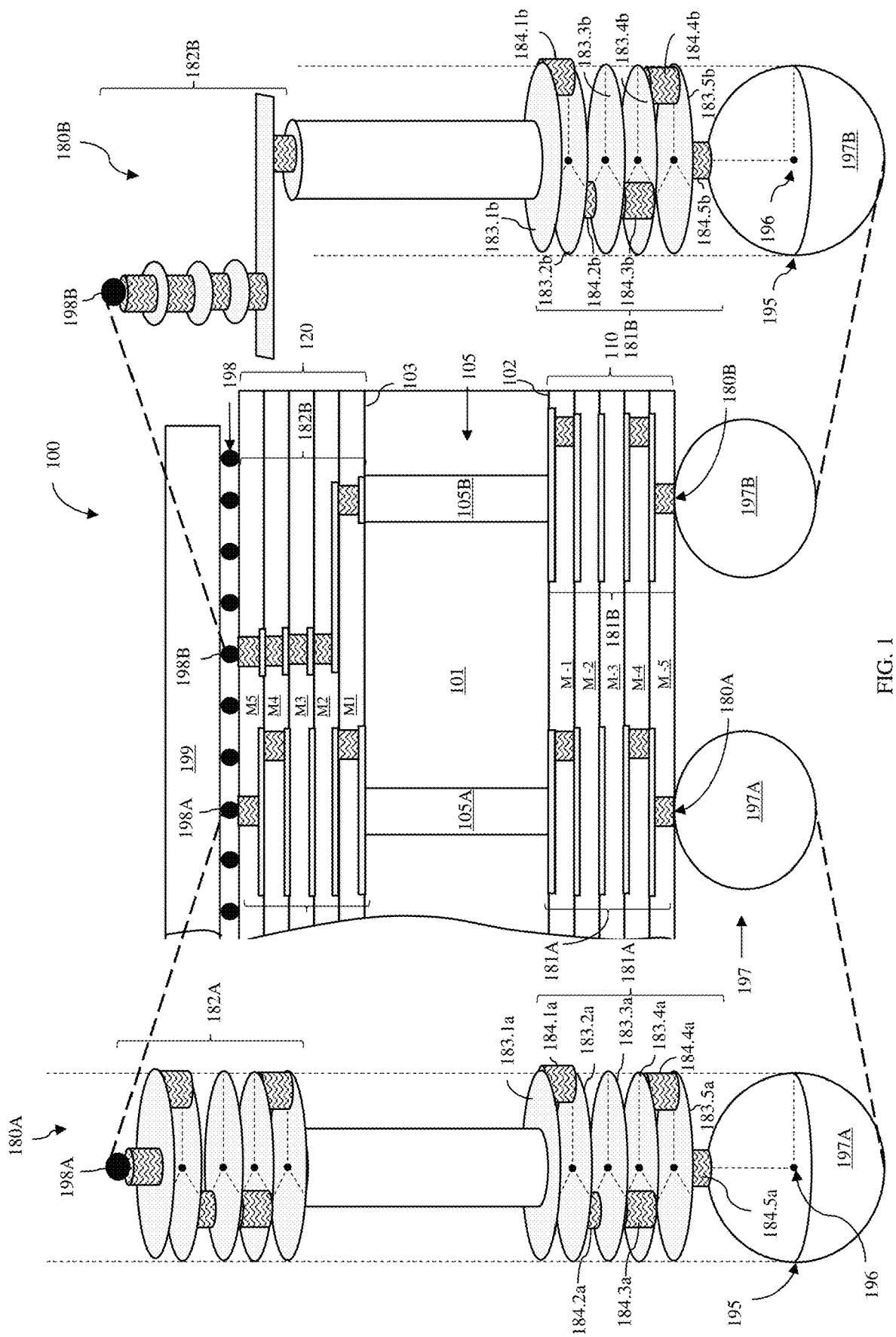
FIG. 1 includes a cross-section diagram illustrating embodiments of a chip module with in-package interconnects having vias in a spiral step pattern and expanded three-dimensional views of the in-package interconnects.
Figure 2:
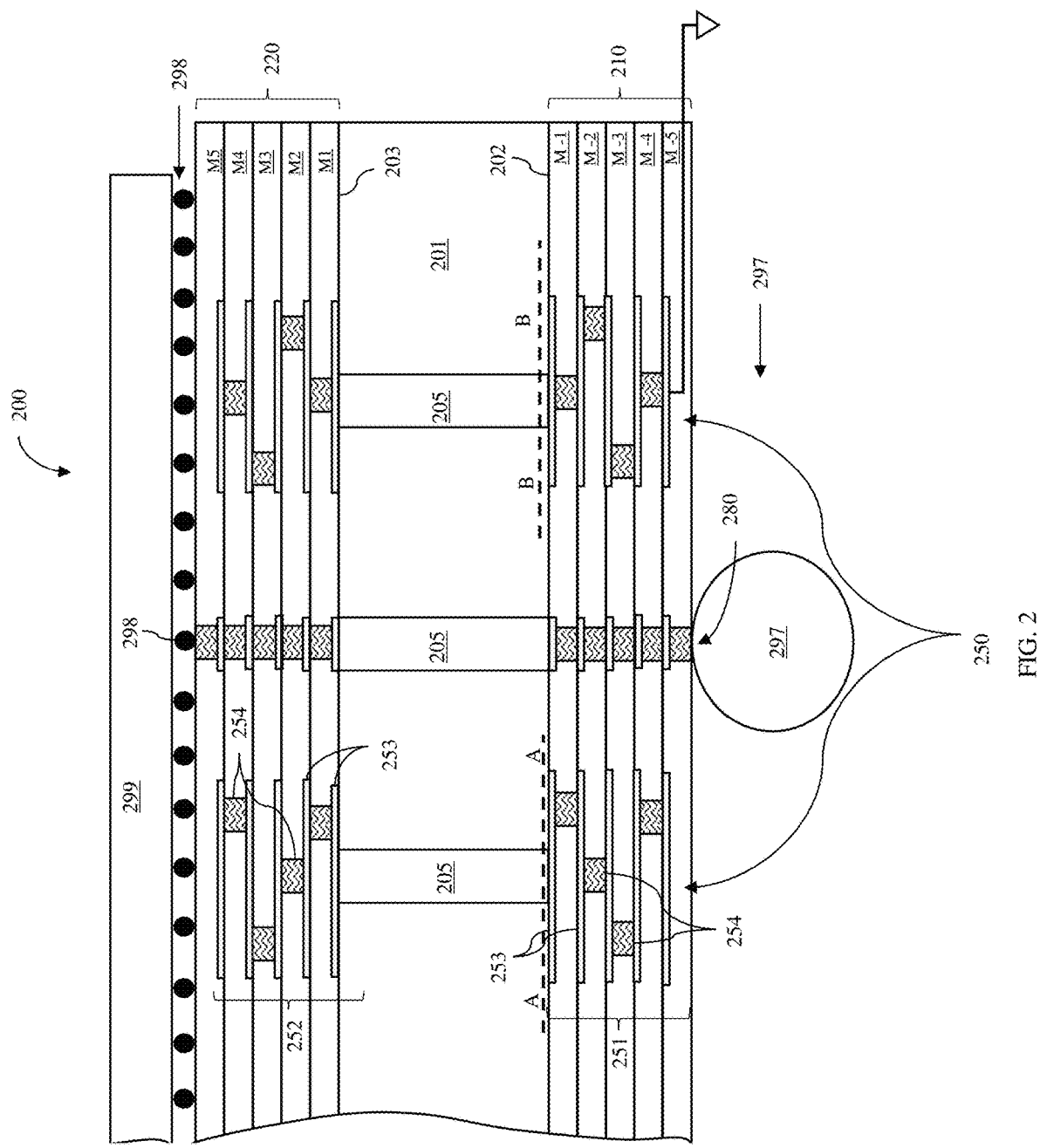
FIG. 2 includes a cross-section diagram illustrating embodiments of a chip module with an in-package interconnect and an interconnect stabilizer laterally surrounding the in-package interconnect.
Figure 3:
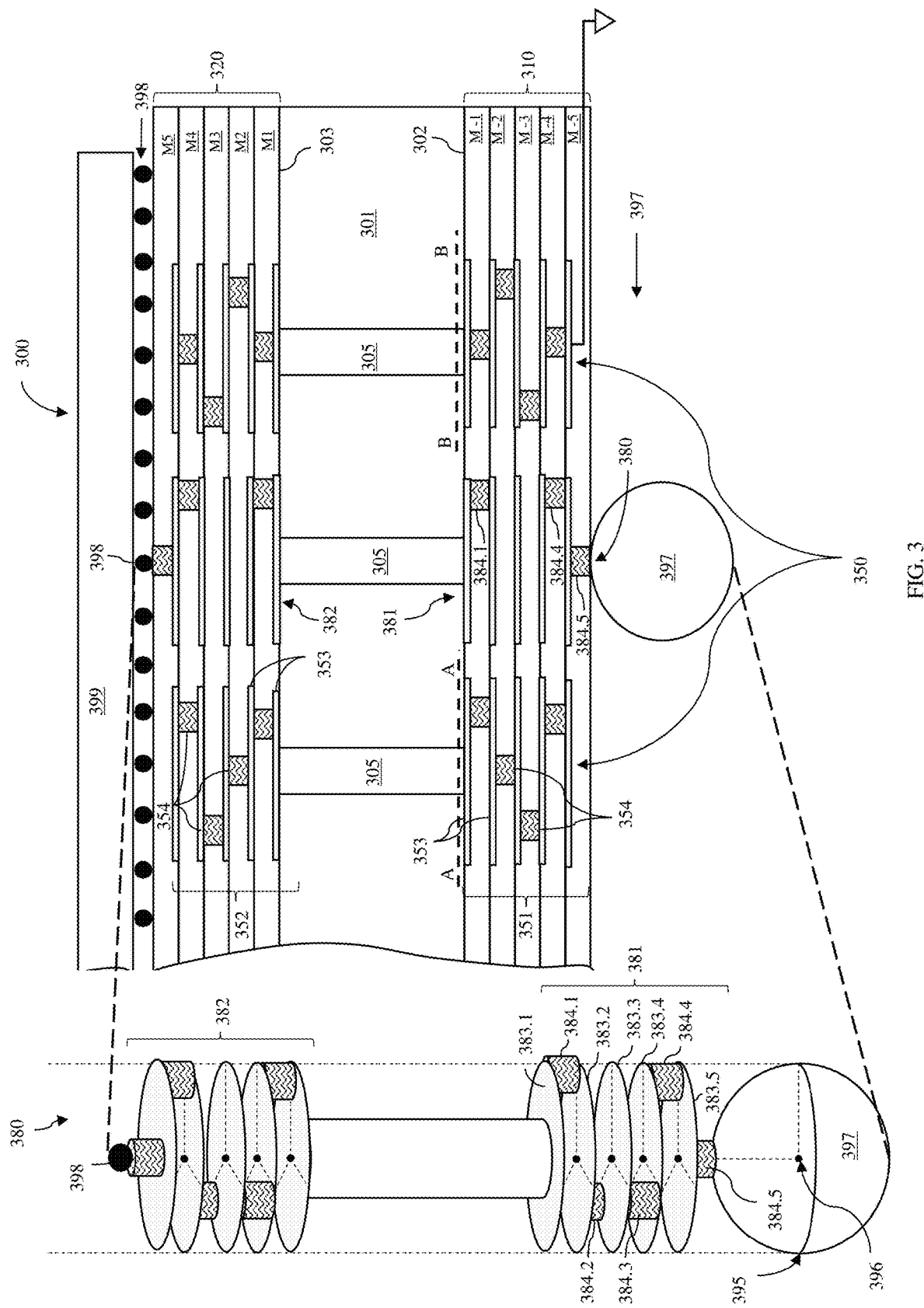
FIG. 3 includes a cross-section diagram illustrating embodiments of a chip module with an in-package interconnect having vias in a spiral step pattern and an interconnect stabilizer laterally surrounding the in-package interconnect.

More particularly, disclosed herein are embodiments of chip module with one or more robust in-package C4-to-solder ball interconnects for reliable performance (e.g., see chip module 100 of FIG. 1, chip module 200 of FIG. 2 and chip module 300 of FIG. 3).

In each of these embodiments, the chip module 100, 200, 300 can include a substrate 101, 201, 301 (also referred to herein as a package substrate, laminate substrate or core). The substrate can include a stack of thin layer or laminates. The laminates can be, for example, epoxy-based laminates or resin-based laminates or laminates of any other suitable package substrate material(s). In any case, the substrate 101, 201, 301 can have a front side 103, 203, 303 and a back side 102, 202, 302 opposite the front side.

Back end of the line (BEOL) metal levels can be on both the front side and the back side of the substrate. That is, front side metal levels 120, 220, 320 (M1 to Mn) can be on the front side of the substrate and back side metal levels 110, 210, 310 (M−1 to M−n) can be on the back side of the substrate. Metal levels M1 and M−1 can be proximal to the substrate on the front side and the back side, respectively, and metal levels Mn and M−n can be distal to the substrate on the front side and the back side, respectively. For purposes of illustration, five back side metal levels and five front side metal levels are shown in the drawings. However, it should be understood that the drawings are not intended to be limiting and that, alternatively, the back side metal levels and the front side metal levels could each include any number of two or more metal levels. Each metal level can include one or more interlayer dielectric (ILD) material layers and one or more metal or metal alloy features extending through and/or between ILD material layers. The metal or metal alloy features in the metal levels can include, but are not limited to, any of the following: vias, which extend vertically through metal layers; via connectors (e.g., conductive planes, such as metal or metal alloy plates or pads, or metal or metal alloy wires), which extend horizontally between metal layers and electrically connect vias; and passive devices (e.g., resistors, inductors, baluns, etc.).

Through substrate vias (TSVs) 105, 205, 305 (e.g., plated through holes) can extend vertically through the substrate from the front side to the back side. These TSVs can electrically connect features in the back side metal levels 110, 210, 310 to features in the front side metal levels 120, 220, 320, as discussed in greater detail below.

Ball grid arrays (BGA) including solder balls 197, 297, 397 can be located on the outermost surface (e.g., on M–n) of the back side metal levels 110, 210, 310. As discussed above, such BGAs enable mounting of the chip module onto a printed circuit board (PCB) and provide electrical connections between the chip module and the PCB (e.g., for power supply, signal transmission, etc.). Controlled collapse chip connections 198, 298, 398 (referred to herein as C4 connections) can be located on the outermost surface (e.g., on Mn) of the front side metal levels 120, 220, 320. The chip module 100, 200, 300 can further include one or more chips (e.g., see chip 199, 299, 399) mounted on and electrically connected to the substrate through the C4 connections. It should be noted that the chip(s) C4 connections 198, 298, 398 could directly connect the chip(s) to Mn, as illustrated. Alternatively, the C4 connections 198, 298, 398 could connect an interposer to Mn chip(s) and additional C4 connections could connect the chip(s) to the interposer (not shown).

Generally, the materials and techniques used to form metal or metal alloy features in metal levels, C4 connections, solder balls, and TSVs are well known in the art and, thus, have been omitted from this specification in order to allow the reader to focus on the salient aspects of the disclosed embodiment. As discussed in greater detail below, the salient aspects of the disclosed embodiments relate specifically to the configuration and patterning of TSVs in the substrate and various metal or metal alloy features in the front side and back side metal levels (including vias, via connectors, etc.) in order to form: (1) a C4-to-solder ball interconnect (i.e., an interconnect structure that electrically connects a C4 connection to a solder ball), which is more robust than a conventional C4-to-solder ball interconnect (e.g., see interconnects 180A and 180B in FIG. 1 or interconnect 380 in FIG. 3); and/or (2) an interconnect stabilizer that laterally surrounds a C4-to-solder ball interconnect for bolstering interconnect robustness (e.g., see the interconnect stabilizer 250 laterally surrounding the interconnect 280 in FIG. 2 or interconnect stabilizer 350 laterally surrounding the interconnect 380 in FIG. 3).

Specifically, in some embodiments, the chip module disclosed herein can include one or more in-package C4-to-solder ball interconnects where interconnect robustness is achieved through the use of vias in a spiral step pattern within the interconnect itself. See the interconnects 180A and 180B of FIG. 1 and interconnect 380A of FIG. 3.

These C4-to-solder ball interconnects 180A, 180B, 380A can electrically connect a particular C4 connection 198A, 198B, 398 on the front side to a particular solder ball 197A, 197B, 397 on the back side. To accomplish this electrical connection, the interconnects 180A, 180B, 380 can each include: a back section 181A, 181B, 381, which is in the back side metal levels 110, 310 and which is electrically connected to the particular solder ball 197A, 197B, 397. The interconnects 180A, 180B, 380 can include further include a front section 182A, 182B, 382, which is in the front side metal levels 120, 320 and which is electrically connected to the particular C4 connection 198A, 198B, 398. The interconnects 180A, 180B, 380 can further include a TSV 105A, 105B, 305, which electrically connects the back section 181A, 181B, 381 to the front section 182A, 182B, 382 and which is center-aligned with a particular solder ball 197A, 197B, 397 (e.g., the TSV 105A, 105B, 305 can be aligned above the center of the particular solder ball).

In each of these interconnects 180A and 180B of the chip module 100 of FIGS. 1 and 380 of the chip module 300 of FIG. 3, the back sections 181A, 181B, and 381 can be configured essentially identical. That is, each back section 181A, 181B, 381 can include a stack of vias in the back side metal levels 110, 310. The stack of vias can include, for example, a via in M–1, a via in M–2, a via in M–3, a via in M–4 and a via in M–5 (e.g., see vias 184.1a-184.5a in the back section 181A of interconnect 180A, vias 184.1b-184.5b in the back section 181B of the interconnect 180B, and vias 384.1-384.5 in the back section 381 of the interconnect 380). These vias can be significantly smaller in size than the solder balls. That is, the circumference 195, 395 of the solder balls within the chip module 100, 300 can be greater than the circumference of each of the vias. The vias 184.1a-184.5a in the back section 181A, vias 184.1b-184.5b in the back section 181B of the interconnect 180B, and vias 384.1-384.5 in the back section 381 of the interconnect 380 can be aligned above the particular solder ball 197A, 197B, 397. That is, each via within the back section 181A, 181B, 381 of each interconnect 180A, 180B, 380 can overlay and, particularly, can be aligned above the particular solder ball 197A, 197B, 397. However, instead of the vias all being center-aligned with the solder ball 197A, 197B, 397 (i.e., stacked one on top of the other over the center 196, 396 of the particular solder ball), in each back section 181A, 181B, 381 adjacent vias within different immediately adjacent metal levels can be offset to form a spiral step pattern of vias above the particular solder ball 197A, 197B, 397.

Specifically, in the back section 181A, 181B, 381 of each interconnect 180A, 180B, 380, a distal via 184.5a, 184.5b, 384.5 in the metal level (e.g., M–5) farthest from the substrate 101, 301 can be center aligned with and adjacent to the particular solder ball 197A, 197B, 397 (i.e., can be aligned above the center 196, 396 of the solder ball). Additionally, in the back section 181A, 181B, 381 of each interconnect 180A, 180B, 380, intermediate vias 184.1a-184.4a, 184.1b-184.5b, 384.1-384.4 can be at different metal levels (e.g., M–1 to M–4) between the TSV 105A, 105B, 305 and the distal via 184.5a, 184.5b, 384.5 and these intermediate vias can be offset in a particular manner so as to form a spiral step pattern, as illustrated in FIGS. 1 and 3 and as further illustrated in the layout diagram of FIG. 4A. That is, instead of being stacked vertically one directly upon the other, the intermediate vias 184.1a-184.4a, 184.1b-184.4b, 384.1-384.4 in each of the back sections 181A, 181B, 381 can be spaced some equidistance D from an imaginary axis that extends vertically through the center 196, 396 of the solder ball 197A, 197B, 397 and TSV 105A, 105B, 305. For example, the intermediate vias 184.1a-184.4a, 184.1b-184.4b, 384.1-384.4 can be aligned above the outer edges of the solder ball 197A, 197B, 397, as illustrated. Any two adjacent intermediate vias in series will be offset from each other by the same distance (i.e., can be equidistance d apart) within the spiral step pattern and any three adjacent intermediate vias in series can form the same degree bend (e.g., see angles Ø) within the spiral step pattern.

For purposes of illustration, the layout the spiral step pattern of vias is shown in FIG. 4A as having an equilateral triangular shape wherein any three adjacent intermediate vias in series form a 60° bend (i.e., Ø=60°). This equilateral triangular shape may be optimal for a solder ball 197A, 197B, 397 with a diameter, for example, of approximately 350 microns (µm) or less. However, for larger solder balls, the optimal layout for the spiral step pattern of vias could have a different equilateral shape (e.g., a square, as shown in FIG. 4B, an equilateral pentagon as shown in FIG. 4C, etc.) wherein any three adjacent intermediate vias in series form a bend with a different angle (e.g., Ø=90°, Ø=108°, etc.). Additionally, for purposes of illustration, five back side metal levels 110, 310 are shown in the drawings such that there are five vias with the back sections 181A, 181B, 381 of the interconnects 180A, 180B, 380. It should, however, be understood that there could be a lesser or a greater number of BEOL metal levels in either of the chip modules 100, 300 such that there are a lesser or number or a greater number of vias to form the spiral step pattern, as described.

In any case, the back section 181A, 181B, 381 can further include via connectors 183.1a-183.5a, 183.1b-183.5b, 383.1-383.5 in the back side metal levels 110, 310. The via connectors can specifically include: via connector 183.1a, 183.1b, 383.1 perpendicular to and between the TSV 105A, 105B, 305 and the via 184.1a, 184.1b, 384.1; via connector 183.2a, 183.2b, 383.2 perpendicular to and between the via 184.1a, 184.1b, 384.1 and the via 184.2a, 184.2b, 384.2; via connector 183.3a, 183.3b, 383.3 perpendicular to and between the via 184.2a, 184.2b, 384.2 and the via 184.3a, 184.3b, 384.3; via connector 183.4a, 183.4b, 383.4 perpendicular to and between the via 184.3a, 184.3b, 384.3 and the via 184.4a, 184.4b, 384.4; and via connector 183.5a, 183.5b, 383.5 perpendicular to and between the via 184.4a, 184.4b, 384.4 and the via 184.5a, 184.5b, 384.5. These via connectors ensure that, within the back section 181A, 181B, 381 of the interconnect 180A, 180B, 380, adjacent vias, which are in different immediately adjacent metal levels and which are offset to form the spiral step pattern, are still electrically connected to each other and further electrically connected to the TSV 105A, 105B, 305.

As illustrated in FIGS. 1 and 3 and further illustrated in FIG. 5A, the via connectors 183.1a-183.5a, 183.1b-183.5b, 383.1-383.5 in the back section 181A, 181B, 381 of the interconnect 180A, 180B, 380 can be conductive planes (e.g., metal or metal alloy plates or pads) and these conductive planes can be patterned into a circular shape with a circumference that is approximately equal to or greater than the circumference 195, 395 of the solder ball so that the vias can be patterned and electrically connected, as described above. Alternatively, as illustrated in FIG. 5B, the via connectors 183.1a-183.5a, 183.1b-183.5b, 383.1-383.5 in the back section 181A, 181B, 381 of the interconnect 180A, 180B, 380 could be conductive planes (e.g., metal or metal alloy plates or pads) patterned into some other suitable shape (e.g., a rectangular or square shape) with dimensions (e.g., length and width) approximately equal to or greater than the diameter of the solder ball again so that the vias can be patterned and electrically connected, as described above. Alternatively, as illustrated in FIG. 5C, the via connectors 183.1a-183.5a, 183.1b-183.5b, 383.1-383.5 in the back section 181A, 181B, 381 of the interconnect 180A, 180B, 380 could be metal or metal alloy wires patterned to electrically connect the vias, as described above.

As mentioned above, each interconnect 180A, 180B, 380 can further include a front section 182A, 182B, 382, which is in the front side metal levels 120, 320 and which provides the electrical connection from the TSV 105A, 105B, 305 to the particular C4 connection 198A, 198B, 398.

When the C4 connection is aligned above the solder ball, the front section could be configured with stacked vias that extend vertically between the TSV and the C4 connection (not shown).

Alternatively, when the C4 connection 198A, 398 is aligned above the solder ball 197A, 397, as is the case of the interconnect 180A in FIG. 1 and the interconnect 380 of FIG. 3, the front section 182A, 382A can be configured in essentially the same manner as the back section 181A, 381, described above. That is, the front section 182A, 382 of the interconnect 180A, 380 can include a stack of vias in the front side metal levels 120, 320. Each via in the front section 182A, 382 can overlay and, particularly, be aligned above the solder ball 197A, 397. However, instead of the vias in the front section 182A, 382 all being center-aligned with the TSV 105A, 305 and the solder ball 197A, 397, adjacent vias within different immediately adjacent metal levels can be offset to form essentially the same spiral step pattern of vias employed in the back section 181A, 381.

For example, in the front section 182A, 382 of the interconnect 180A, 380, the stack of the vias can include a distal via in the metal level farthest from the substrate 101, 301 (e.g., in metal level M5) in contact with the C4 connection 198A, 398. This distal via can be center aligned with the TSV 105A, 305 and the solder ball 197A, 397. Intermediate vias at different metal levels (e.g., at metal levels M1 to M4) between the TSV 105A, 305 and the distal via can be offset to form the spiral step pattern. That is, the intermediate vias can be aligned above the outer edges of the solder ball 197A, 397, any two adjacent intermediate vias in series can be offset from each other by the same distance (i.e., can be an equidistance d apart), and any three adjacent intermediate vias in series can form the same degree bend (e.g., see angles Ø) within the spiral step pattern. The front section 182A, 382 can further include via connectors in the front side metal levels 120, 320 perpendicular to and between adjacent vias within the stack and further perpendicular to and between the stack and the TSV. These via connectors ensure that, within the front section 182A, 382 of the interconnect 180A, 380, adjacent vias, which are in different immediately adjacent metal levels and which are offset to form the spiral step pattern, are still electrically connected to each other and further electrically connected to the TSV 105A, 305.

When the particular C4 connection 198B is not aligned above the solder ball 197B (i.e., when the C4 connection 198B and the solder ball 197B are completely offset), as in the case of the interconnect 180B, the front section 182B can, for example, be configured as follows. Stacked via(s) can be in the lower metal level(s) proximal to the TSV 105B and further center-aligned with the TSV 105B and the solder ball 197B. Stacked via(s) can also be in the upper metal level(s) distal to the TSV 105B and also center-aligned with the particular C4 connection 198B, and a wire in one of the metal levels can extend laterally between and electrically connect the stacked via(s) in the lower metal level(s) to the stacked via(s) in the upper metal level(s). Thus, in this case, only the back section 181B of the interconnect 180B has spiral step patterned vias.

Referring to FIGS. 2 and 3, in some embodiments, the chip module 200, 300 can include an interconnect stabilizer 250, 350 (referred to herein as a stabilization structure, fence or cage), which laterally surrounds at least one interconnect 280, 380 in order to provide mechanical stability (i.e., robustness). Specifically, in these embodiments, the chip module 200, 300 can include at least one in-package C4-to-solder ball interconnect 280, which electrically connects one of the C4 connections 298 to one of the solder balls 297. In the chip module 200, the in-package C4-to-solder ball interconnect 280 can have any conventional C4-to-solder ball interconnect structure. For example, it can include: a TSV 205; a back section in the back side metal levels 210 and including stacked vias between the solder ball 297 and the TSV 205; and a front section in the front side metal levels 220 and including stacked vias between the TSV 205 and the C4 connection 298. In the chip module 300, the in-package C4-to-solder ball interconnect 380 can be configured, as described in detail above, with spiral step patterned vias for added robustness.

In any case, the chip module 200, 300 can further include an interconnect stabilizer 250, 350 (also referred to herein as an interconnect stabilization structure, fence or cage)). This interconnect stabilizer 250, 350 can laterally surround the interconnect 280, 380. Additionally, it can be electrically isolated from the interconnect 280, 380, from the C4 connections 298, 398 (and thereby from any chip(s) 299, 399 within the chip module 200, 300), and from the solder balls 297, 397 (and thereby the PCB on which the chip module 200, 300 is mounted). Thus, it should be understood that the interconnect stabilizer 250, 350 is not intended to be employed for signal routing.

The interconnect stabilizer 250, 350 can include: a back section 251, 351 in the back side metal levels 210, 310; a front section 252, 352 in the front side metal levels 220, 320; and one or more TSVs 205, 305 that extend between and electrically connect the back section 251, 351 to the front section 252, 352. The back and front sections 251-252, 351-352 of the interconnect stabilizer 250, 350 can be essentially the same. That is, the back and front sections 251-252 can both include one or more stacked rings of vias 254, 354 within the metal levels, respectively, and encircling the interconnect 280. Since, as mentioned above, the back section 251, 351 is electrically isolated from the solder balls 297, 297 and the front section 252, 352 is electrically isolated from the C4 connections 298, 398 at least the most distal metal level of the back side metal levels (e.g., M–5) and the most distal metal level of the front side metal levels (e.g., M5) will be devoid of via rings. Via rings can be formed, for example, in the front side metal levels M1-M4 and in the back side metal levels M–1 to M–4 so that each ring is in a different metal level and encircles a portion of the interconnect 280, 380 within that same metal level. The rings of vias in the different metal levels can have essentially the same radius such that they form a set of stacked rings of vias. Optionally, instead of one set of stacked rings of vias encircling the interconnect 280, 380, the interconnect stabilizer 250, 350 could include multiple sets of stacked rings of vias. Each set of stacked rings of vias can encircle the interconnect 280, 380 and the sets can have progressively larger radiuses so that the stacked rings of vias are concentric (i.e., so that the interconnect stabilizer 250, 350 includes concentric stacked rings of vias). Furthermore, in any given set of stacked rings of vias within the interconnect stabilizer 250, 350 adjacent vias in different immediately adjacent metal levels can be offset in a repeating step pattern for improved mechanical stability.

Figure 6:
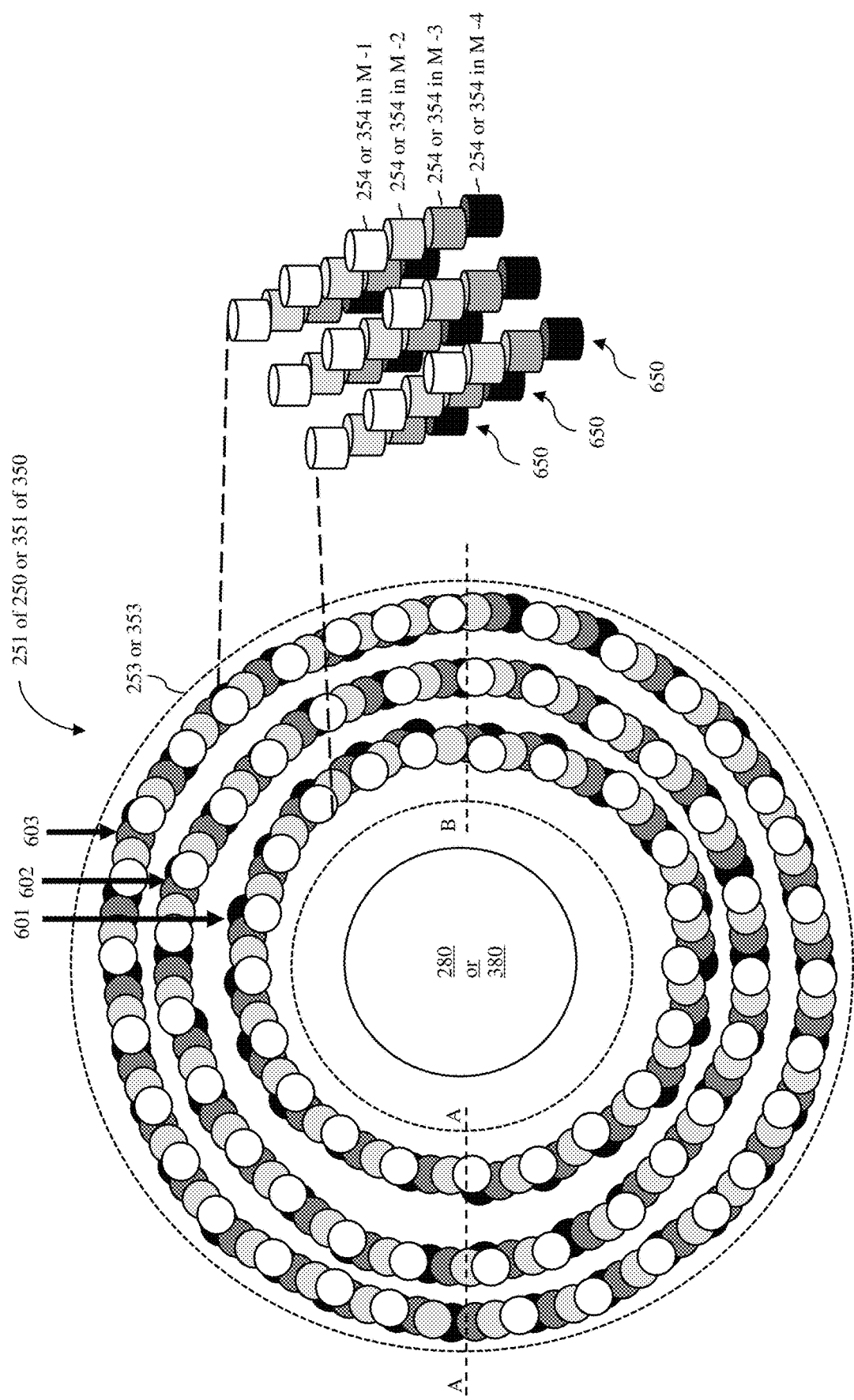
FIG. 6 is an exemplary layout diagram illustrating an exemplary back section of an interconnect stabilizer of either FIG. 2 or FIG. 3.

For example, FIG. 6 is an exemplary layout diagram illustrating an exemplary back section 251, 351 of the interconnect stabilizer 250, 350. In this exemplary back section 251, 351, vias 254, 354 in the different metal levels (e.g., M–1 to M–4) are represented by different shades (e.g., black in M–4, dark grey in M–3, light grey in M–2 and white in M–1). The back section 251, 351 includes a set 601 of stacked rings of vias 254, 354 where each ring in the set 601 is in a different one of the metal levels M–1 to M–4, each ring in the set 601 encircles the interconnect 280, 380 (i.e., includes vias patterned in a circle around the interconnect), and each ring in the set 601 has essentially the same radius such that the rings of vias are stacked one on top of the other. The back section 251, 351 can also include optional sets 602 and 603 of stacked rings of vias 254, 354.

The rings of vias in the sets 602 and 603 can encircle the interconnect 280, 380 and can be configured essentially the same as the rings of vias in the set 601 described above, except that the radius of the rings in the set 602 can be greater than the radius of the rings in the set 601 and the radius of the rings in the set 603 can be greater than the radius of the rings in the set 602. Thus, the stacked rings of vias in set 602 encircle the stacked rings of vias in set 601 and the stacked rings of vias in set 603 encircle the stacked rings of vias in set 602. In other words, the stacked rings of vias in the sets 601-603 are concentric stacked rings of vias. Furthermore, as illustrated in FIG. 6, within the stacked rings of vias in each of these sets 601-603, adjacent vias in different immediately adjacent metal levels are offset in a repeating step pattern 650. It should be noted that within this repeating step pattern 650 adjacent vias in the different metal levels are shown as partially overlapping each other from one metal level to the next. However, it should be understood that the drawings are not intended to be limiting and that, alternatively, the vias within each repeating step pattern 650 could be completely offset from one metal level to the next.

Referring again to FIGS. 2 and 3, the interconnect stabilizer 250, 350 can further include multiple stacked conductive plates 253, 353. Specifically, the conductive plates 253, 353 can be horizontally oriented and located at the interface between the front side 203, 303 of the substrate 201, 301 and the M1 metal level, at the interfaces between the front side metal levels 220, 320 (e.g., between M1 and M2, between M2 and M3, and so on), at the interface between the back side 202, 302 of the substrate 201, 301 and the M–1 metal level, and at the interfaces between the back side metal levels 210, 310 (e.g., between M–1 and M–2, between M–2 and M–3, and so on). Each conductive plate 253, 353 can encircle the interconnect 280, 380. That is, each conductive plate 283, 383 can be relatively large, can have a round or square disc shape, and can have a center opening aligned with the interconnect 280, 380. The interconnect 280, 380 can extend vertically through the center openings in the conductive plates 253, 353 to make the C4-to-solder ball connection without contacting the conductive plates 253, 353. Additional space within the center openings in the conductive plates 253, 353 (i.e., the space between the interconnect 280, 380 and the conductive plates 283, 353) can be filled with ILD material.

The above-mentioned vias 254, 354 can extend vertically between and be in contact with adjacent conductive plates 283 (i.e., with immediately adjacent upper and lower conductive plates) such that within the back section 251, 351 all the vias 254, 354 and conductive plates 253, 353 are electrically connected and such that within the front section 252 all the vias 254, 354 and conductive plates 253, 353 are similarly electrically connected. It should be understood that the dimensions of the conductive plates 253, 353 should be sufficient to ensure that the vias in the outermost stacked rings can extend vertically between adjacent conductive plates.

It should be noted that FIG. 6 is provided and discussed in detail above to illustrate the positional relationships between the vias 254, 354 within the stacked rings of vias in each set 601-603. The conductive plates 253, 353 were omitted from this drawing in order to avoid clutter and to allow the reader to better visualize the positional relationships between the vias 254, 354 and, particularly, the repeating step pattern 650. However, FIG. 6 does indicate an outline of one exemplary shape (e.g., a circular disc shape with a center opening) that could be employed for each of the conductive plates 253, 353.

The interconnect stabilizer 250, 350 can further one or more of the TSVs 205, 305, which as mentioned above extend vertically through the substrate 201, 301 from the back side 202, 302 to the front side 203, 303. In this case, TSV(s) 205, 305 can extend vertically between and be in contact with the proximal conductive plates of the back and front sections 251-252, 351-352 of the interconnect stabilizer 250, 350. That is, TSV(s) 205, 305 can extend vertically from the conductive plate in the back section 251, 351 of the interconnect stabilizer 250, 350 at the interface between the back side 202, 302 of the substrate 201, 301 and the metal level M−1 to the conductive plate in the front section 252, 352 of the interconnect stabilizer 250, 350 at the interface between the front side 203, 303 of the substrate 201, 301 and the metal level M1.

Optionally, the interconnect stabilizer 250, 350 can include multiple such TSVs 205, 305 that laterally surround the interconnect 280, 380. In any case, the TSV(s) 205, 305 that are incorporated into the interconnect stabilizer 250, 350 can ensure that the back section 251, 351 and the front section 252, 352, including the vias 254, 354 and conductive plates 253, 353 therein, are all electrically connected. As mentioned above, the interconnect stabilizer 250, 350 can be electrically isolated from the interconnect 280, 380, from the C4 connections 298, 398 (and thereby from any chip(s) 299, 399 within the chip module 200, 300) and further from the solder balls 297, 397 (and thereby from the PCB on which the chip module 200, 300 is mounted). Thus, the interconnect stabilizer 250, 350 is not intended to be employed for signal routing. However, optionally, the interconnect stabilizer 250, 350 could be grounded. That is, one or more of the conductive plates 253, 353 within the interconnect stabilizer 250, 350 could be electrically connected to ground.

Optionally, in the chip module 200 of FIG. 2 or 300 of FIG. 3, all C4-to-solder ball interconnects 280, 380 could be laterally surrounded by such an interconnect stabilizer 250, 350. Alternatively, only one or more C4-to-solder ball interconnects 280, 380 deemed to be critical could be laterally surrounded by an interconnect stabilizer 250, 350. As illustrated, discrete interconnect stabilizers 250, 350 could be employed, as necessary, to provide mechanical stability to individual C4-to-solder ball interconnects 280, 380, respectively. Alternatively, a single relatively large interconnect stabilizer could be formed (e.g., in a grid pattern) with individual portions that are configured as described above and that laterally surround multiple C4-to-solder ball interconnects.

Therefore, disclosed above are various embodiments of a chip module with one or more robust in-package C4-to-solder ball interconnects for reliable performance. In the chip module 100 of FIG. 1, interconnect robustness is achieved through the use of vias in a spiral step pattern within each interconnect 180A, 180B. In the chip module 200 of FIG. 2, interconnect robustness is achieved through the use of an interconnect stabilizer 250, which includes vias in a repeating step pattern encircling the in-package interconnect 280, which is electrically isolated from back side solder balls, front side collapse chip connections, and the interconnect itself, and which is optionally connected to ground. In the chip module 300 of FIG. 3, interconnect robustness is achieved through the use of a combination of both vias in a spiral step pattern within an interconnect 380 and an interconnect stabilizer 350. Such features provide both improved stress tolerance and controlled impedance transformation for mmWave applications.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A structure comprising:
a substrate having a front side and a back side opposite the front side;
back side metal levels on the back side of the substrate;
a solder ball on the back side metal levels; and
an interconnect electrically connected to the solder ball, wherein the interconnect comprises:
a stack of vias in the back side metal levels aligned with the solder ball, the stack of vias including intermediate vias in different back side metal levels of the back side metal layers, wherein the intermediate vias in the different back side metal levels are offset in a spiral step pattern; and
via connectors in the back side metal levels perpendicular to and between the intermediate vias within the stack of vias such that adjacent intermediate vias in the stack of vias are electrically connected, wherein, within the stack of vias, any two adjacent intermediate vias are offset by a same distance and any three adjacent intermediate vias in series form a same degree bend within the spiral step pattern, and wherein the intermediate vias are aligned with outer edges of the solder ball.

2. The structure of claim 1,
wherein the interconnect further comprises a through substrate via that extends through the substrate from the front side to the back side and that is center aligned with the solder ball, and wherein the stack of the vias comprises a distal via adjacent to and center aligned with the solder ball.

3. The structure of claim 1, wherein the same degree bend comprises a 60° bend.

4. The structure of claim 1, wherein the via connectors comprise any of the conductive planes and wires.

5. The structure of claim 1, further comprising:
front side metal levels on the front side of the substrate;
controlled collapse chip connections on the front side metal levels;
a chip mounted on the front side by the controlled collapse chip connections;
solder balls on the back side metal levels; and
through substrate vias extending through the substrate from the front side metal levels to the back side metal levels,
wherein the interconnect further comprises:
a through substrate via;
a back section in the back side metal levels electrically connecting the solder ball to the through substrate via; and
a front section in the front side metal levels electrically connecting the through substrate via to a controlled collapse chip connection.

6. The structure of claim 5, wherein the controlled collapse chip connection and the solder ball electrically connected by the interconnect are center-aligned and wherein both the back section and the front section of the interconnect have spiral step patterned vias.

7. The structure of claim 5, wherein the controlled collapse chip connection and the solder ball electrically connected by the interconnect are offset, wherein the back section of the interconnect has spiral step patterned vias, and wherein the front section of the interconnect has stacked vias.

8. A structure comprising:
a substrate having a front side and a back side opposite the front side;
through substrate vias extending through the substrate from the front side to the back side;
front side metal levels on the front side of the substrate;
back side metal levels on the back side of the substrate;
controlled collapse chip connections on the front side metal levels;
solder balls on the back side metal levels;
an interconnect electrically connecting a controlled collapse chip connection to a solder ball; and
a stabilizer laterally surrounding the interconnect, wherein the stabilizer is electrically isolated from the controlled collapse chip connections, the solder balls, and the interconnect and wherein the stabilizer comprises:

vias in the front side metal levels and in the back side metal levels encircling the interconnect, wherein adjacent vias in different metal levels are offset in a repeating step pattern;
conductive plates in the front side metal levels and in the back side metal levels encircling the interconnect, wherein each via extends between and is in contact with adjacent conductive plates; and
at least one of the through substrate vias extending between and in contact with proximal conductive plates such that the vias are electrically connected.

9. The structure of claim 8, wherein the stabilizer further comprises concentric circles of the vias around the interconnect.

10. The structure of claim 8, further comprising a chip mounted on the substrate by the controlled collapse chip connections, wherein the chip overlays the interconnect and the stabilizer.

11. The structure of claim 8, wherein the stabilizer is electrically connected to ground.

12. The structure of claim 8, wherein the interconnect comprises stacked vias in the front side metal levels and in the back side metal levels.

13. The structure of claim 8, wherein the interconnect comprises spiral step patterned vias in the front side metal levels and in the back side metal levels.

14. A structure comprising:
a substrate having a front side and a back side opposite the front side;
through substrate vias extending through the substrate from the front side to the back side;
front side metal levels on the front side of the substrate;
back side metal levels on the back side of the substrate;
controlled collapse chip connections on the front side metal levels;
solder balls on the back side metal levels;
an interconnect electrically connected to a solder ball and a controlled collapse chip connection, wherein the interconnect comprises:
a through substrate via center aligned with the solder ball;
stacks of vias at opposite ends of the through substrate via in the front side metal levels and in the back side metal levels, wherein the vias in the stacks are aligned with the solder ball and wherein, within the stacks, adjacent vias in different metal levels are offset in a spiral step pattern; and
via connectors perpendicular to and between the vias within the stacks such that the adjacent vias are electrically connected; and
a stabilizer laterally surrounding the interconnect, wherein the stabilizer is electrically isolated form the controlled collapse chip connections, the solder balls, and the interconnect.

15. The structure of claim 14,
wherein, within the back side metal level, one stack of the vias of the interconnect comprises: a distal via adjacent to and center aligned with the solder ball and intermediate vias at different levels between the distal via and the through substrate via,
wherein the intermediate vias are aligned with outer edges of the solder ball, and
wherein, within the stack of the vias, any two adjacent intermediate vias are offset by a same distance and any three adjacent intermediate vias in series form a same degree bend within the spiral step pattern.

16. The structure of claim 15, wherein the same degree bend comprises a 60° bend.

17. The structure of claim 14, wherein the stabilizer comprises:
- additional vias in the front side metal levels and in the back side metal levels encircling the interconnect, wherein, within adjacent metal levels, adjacent additional vias are offset in a repeating step pattern;
- conductive plates in the front side metal levels and in the back side metal levels encircling the interconnect, wherein each additional via extends between and is in contact with adjacent conductive plates; and
- at least one of the through substrate vias extending between and in contact with proximal conductive plates.

18. The structure of claim 17, wherein the stabilizer further comprises concentric circles of the additional vias around the interconnect.

19. The structure of claim 17, further comprising a chip mounted on the substrate by the controlled collapse chip connections, wherein the chip overlays the interconnect and the stabilizer.

20. The structure of claim 17, wherein the stabilizer is electrically connected to ground.

* * * * *